(12) United States Patent
Herbeck

(10) Patent No.: US 9,413,361 B1
(45) Date of Patent: Aug. 9, 2016

(54) CLOSED LOOP CLOCK SIGNAL GENERATOR WITH MULTIPLE REFERENCE CLOCKS

(71) Applicant: Apple Inc., Cupertino, CA (US)

(72) Inventor: Gilbert H. Herbeck, Livermore, CA (US)

(73) Assignee: Apple Inc., Cupertino, CA (US)

( * ) Notice: Subject to any disclaimer, the term of this patent is extended or adjusted under 35 U.S.C. 154(b) by 16 days.

(21) Appl. No.: 14/608,107

(22) Filed: Jan. 28, 2015

(51) Int. Cl.
*H03L 7/06* (2006.01)
*H03L 7/08* (2006.01)

(52) U.S. Cl.
CPC .................................... *H03L 7/0802* (2013.01)

(58) Field of Classification Search
None
See application file for complete search history.

(56) References Cited

U.S. PATENT DOCUMENTS

| 7,343,504 | B2 | 3/2008 | Fernald et al. |
| 7,536,570 | B2 | 5/2009 | Leung et al. |
| 7,689,839 | B2 | 3/2010 | Uguen et al. |
| 8,008,949 | B1 | 8/2011 | Kallam |
| 2006/0056491 | A1* | 3/2006 | Lim ....................... H03L 7/0805 375/130 |
| 2011/0260763 | A1* | 10/2011 | Wang ....................... H03L 7/087 327/157 |
| 2013/0147526 | A1 | 6/2013 | Kim et al. |

OTHER PUBLICATIONS

"K10 Sub-Family Reference Manual"; Freescale Semiconductor, Inc.; Nov. 2011; Section 3.4 and Chapters 5, 24-26; 1581 pages; Rev. 6.

* cited by examiner

*Primary Examiner* — Cassandra Cox
(74) *Attorney, Agent, or Firm* — Meyertons, Hood, Kivlin, Kowert & Goetzel, P.C.

(57) ABSTRACT

A system may include a processor, a first clock source generating a first clock signal, a second clock source generating a second clock signal, and a clock generation unit. In a first closed-loop mode of operation, the clock generation unit may be configured to generate a system clock signal at a target frequency by comparing the system clock signal to the first clock signal. The clock generation unit may be configured to generate the system clock signal in an open-loop mode of operation in response to a transition in a control signal. The clock generation unit may be configured to operate in a second closed-loop mode of operation after operating in the open-loop mode of operation, wherein the clock generation unit is configured to generate the system clock signal at substantially the same target frequency by comparing the system clock signal to the second clock signal.

20 Claims, 6 Drawing Sheets

CLOSED LOOP CLOCK SIGNAL GENERATOR WITH MULTIPLE REFERENCE CLOCKS

BACKGROUND

1. Technical Field

Embodiments described herein are related to the field of integrated circuit implementation, and more particularly to the implementation of clock signal generators.

2. Description of the Related Art

Computing systems may include one or more systems-on-a-chip (SoCs), which may integrate a number of different functions, such as, application execution, graphics processing and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

SoC designs may include one or more clock signal generators, configured to output a clock signal at a target frequency. Some clock signal generators, such as phased-locked loops and frequency-locked loops, utilize a reference clock to generate clock signals of a different frequency than the reference clock. Generally, a reference clock with a higher frequency can support an output clock signal with a more accurate target frequency. Generating higher frequency reference clock signals, however, may consume more power than generating lower frequency clock signals. Since SoCs may be used in portable applications, balancing power consumption with timing accuracy may be desirable or even necessary. A clock signal generator that can support both accuracy and reduced power consumption is contemplated.

SUMMARY OF THE EMBODIMENTS

Various embodiments of a clock generation unit are disclosed. Broadly speaking, a system, an apparatus, and a method are contemplated in which the system includes a processor, wherein at least a portion of the processor is clocked by a system clock signal, a first clock source generating a first reference clock signal, a second clock source generating a second reference clock signal with a frequency that is lower than a frequency of the first reference clock signal, and a clock generation unit. The clock generation unit is configured to operate in a first closed-loop mode of operation, wherein the clock generation unit is configured to generate the system clock signal at a target frequency by comparing the system clock signal to the first reference clock signal during the first closed-loop mode of operation. The clock generation circuit is configured to generate the system clock signal in an open-loop mode of operation in response to a transition in a control signal. The clock generation circuit is also configured to operate in a second closed-loop mode of operation after operating in the open-loop mode of operation, wherein the clock generation unit is configured to generate the system clock signal at substantially the same target frequency by comparing the system clock signal to the second reference clock signal during the second closed-loop mode of operation.

In a further embodiment, the clock generation unit is configured to generate the system clock signal at a first multiple of the frequency of the first reference clock signal during the first closed-loop mode of operation and to generate the system clock signal at a second multiple of the frequency of the second reference clock signal during the second closed-loop mode of operation. In addition, the second multiple is greater than the first multiple.

In one embodiment, during the first closed-loop mode of operation, the clock generation unit is configured to determine a number of system clock signal pulses occurring during a given duration of the first reference clock signal, and to compare the number of system clock signal pulses to a first target count value to determine a first comparison value. The clock generation unit is configured to then adjust the frequency of the system clock signal dependent upon the first comparison value.

In a further embodiment, during the second closed-loop mode of operation, the clock generation unit is configured to determine a number of system clock signal pulses occurring during a given duration of the second reference clock signal, and to compare the number of system clock signal pulses to a second target count value to determine a second comparison value. The clock generation unit is configured to then to adjust the frequency of the system clock signal dependent upon the second comparison value.

In another embodiment, the clock generation unit includes a comparison circuit, wherein the comparison circuit is configured to store the first target count value in a register responsive to operating in the first closed-loop mode of operation. The comparison circuit is further configured to change a value stored in the register from the first target count value to the second target count value while operating in the open-loop mode of operation.

In one embodiment, the first clock source is further configured to disable the generation of the first reference clock signal responsive to the clock generation unit operating in the second closed-loop mode of operation. In another embodiment, the system further comprises a power management unit with a plurality of power modes. The power management unit is configured to request that the clock generation unit operate in the first closed-loop mode of operation in response to a determination that the power management unit is preparing to change power modes.

BRIEF DESCRIPTION OF THE DRAWINGS

The following detailed description makes reference to the accompanying drawings, which are now briefly described.

Figure 1:
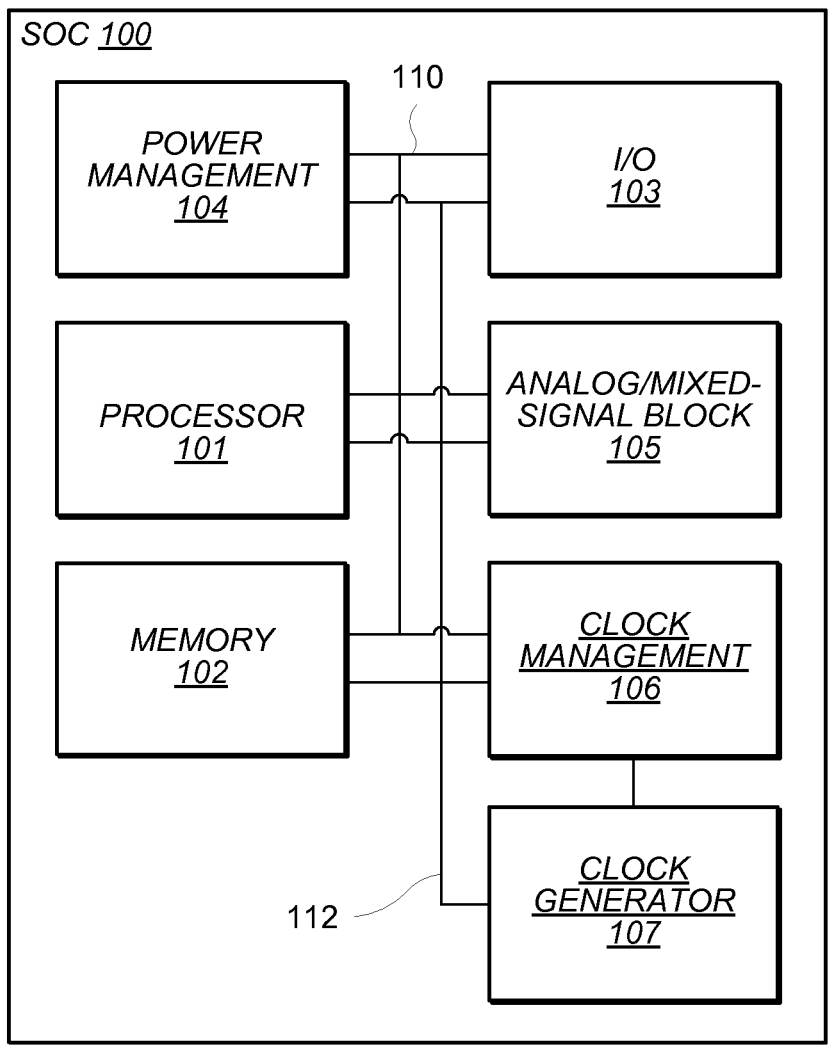
FIG. 1 illustrates an embodiment of a system-on-a-chip (SoC).

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more functional blocks, such as, e.g., a processor and one or more memories, which may integrate the function of a computing system onto a single integrated circuit. Some SoC designs may utilize high frequency clock signals to maximize the performance capabilities of the SoC. In some cases, certain tasks may require the accuracy of such high frequency clock signals fall within predetermined ranges. Generally speaking, a clock source may generate a clock signal at or near a target frequency. Over time, however, the frequency may drift due to a variety of reasons, including temperature changes, supply voltage changes, or the design of the clock source. For example, an SoC may utilize clock signals with a target frequency one Gigahertz, but require the frequency to be within a predetermined range, such as, for example, within 1% of one gigahertz (i.e., between 990 Megahertz and 1.01 Gigahertz) to perform certain tasks. Some clock sources, such as crystal oscillators, may be very accurate, but may not be capable of attaining the desired frequency. Other clock sources, such as astable multivibrators, may be capable of achieving the desired high frequency, but may drift beyond the predetermined frequency range.

To generate high frequency clock signals with acceptable frequency accuracy, some SoCs may include one or more "closed-loop" clock signal generators that use an adjustable high-frequency oscillator to generate the clock signal and continuously or periodically monitor the clock signal frequency by comparing the generated clock signal to a higher-accuracy, lower-frequency reference clock. Some examples of such closed-loop clock generators include phase-locked loops (PLLs), delay-locked loops (DLLs), and frequency-locked loops (FLLs). Closed-loop clock generators, such as, for example, FLLs, may produce an amount of jitter in the generated clock signal dependent upon a frequency of the reference clock. As used herein "jitter" may refer to a change in the period (and therefore frequency) of the clock signal over a predetermined amount of time and is therefore related to the accuracy of the clock signal. In some closed-loop clock generators, such as an FLL, the larger the difference between the frequency of the reference clock and the frequency of the generated clock, the more jitter is produced and the resulting accuracy of the generated clock may not meet requirements for all tasks. For these tasks, less jitter in the generated clock signal may be required for proper operation. Depending on a task being performed at a given time, an SoC may require a reference clock with a higher frequency to reduce jitter of the generated clock signal. During performance of other tasks, however, the SoC may not require the accuracy of the higher frequency reference clock and may reduce power consumption by using a lower frequency reference clock.

The embodiments illustrated in the drawings and described below may allow a clock signal generator to switch between two reference clock signals. These embodiments may employ techniques that may allow for a clock signal to be output while the clock signal generator switches from one reference clock to the other.

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, clock management unit 106, all coupled through bus 110. Additionally, clock generator 107 may be coupled to clock management unit 106 and provide a clock signal 112 to the functional blocks in SoC 100. In various embodiments, SoC 100 may be configured for use in a mobile computing application such as, e.g., a tablet computer, smartphone or wearable device.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks via bus 110, such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example. Memory block 102, may, in some embodiments, include a memory controller for interfacing to memory external to SoC 100, such as, for example, one or more DRAM chips.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O block 103 may include general-purpose input/output pins (I/O pins). In some embodiments, I/O block 103 may be configured to implement a version of Universal Serial Bus (USB) protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks in SoC 100, such as for reduced power modes, for example.

Analog/mixed-signal block 105 may include a variety of circuits including, for example, a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in analog/mixed signal block 105. In some embodiments, analog/mixed-signal block 105 may also include, in some embodiments, radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to enable, configure and manage outputs of one or more clock sources. In various embodiments, the clock sources may be located in analog/mixed-signal block 105, in clock management unit 106, in other blocks with SoC 100, or come from external to SoC 100, coupled through one or more I/O pins. In some embodiments, clock management 106 may be capable of configuring a selected clock source before it is distributed throughout SoC 100. Clock management unit 106 may include registers for selecting an output frequency or reference clock of a PLL, FLL, DLL, or other type of closed-loop clock source.

Clock generator 107 may be a sub-module of analog/mixed signal block 105 or clock management unit 106. In other embodiments, clock generator 107 may be a separate module within SoC 100. One or more clock sources may be included in clock generator 107. In some embodiments, clock generator 107 may include PLLs, FLLs, DLLs, internal oscillators, oscillator circuits for external crystals, etc. One or more clock signal outputs 112 may provide clock signals to various functional blocks of SoC 100.

System bus 110 may be configured as one or more buses to couple processor 101 to the other functional blocks within the SoC 100 such as, e.g., memory block 102, and I/O block 103. In some embodiments, system bus 110 may include interfaces coupled to one or more of the functional blocks that allow a particular functional block to communicate through the bus. In some embodiments, system bus 110 may allow movement of data and transactions (i.e., requests and responses) between functional blocks without intervention from processor 101.

For example, data received through the I/O block 103 may be stored directly to memory block 102.

It is noted that the SoC illustrated in FIG. 1 is merely an example. In other embodiments, different functional blocks and different configurations of functions blocks may be possible dependent upon the specific application for which the SoC is intended.

Figure 2:
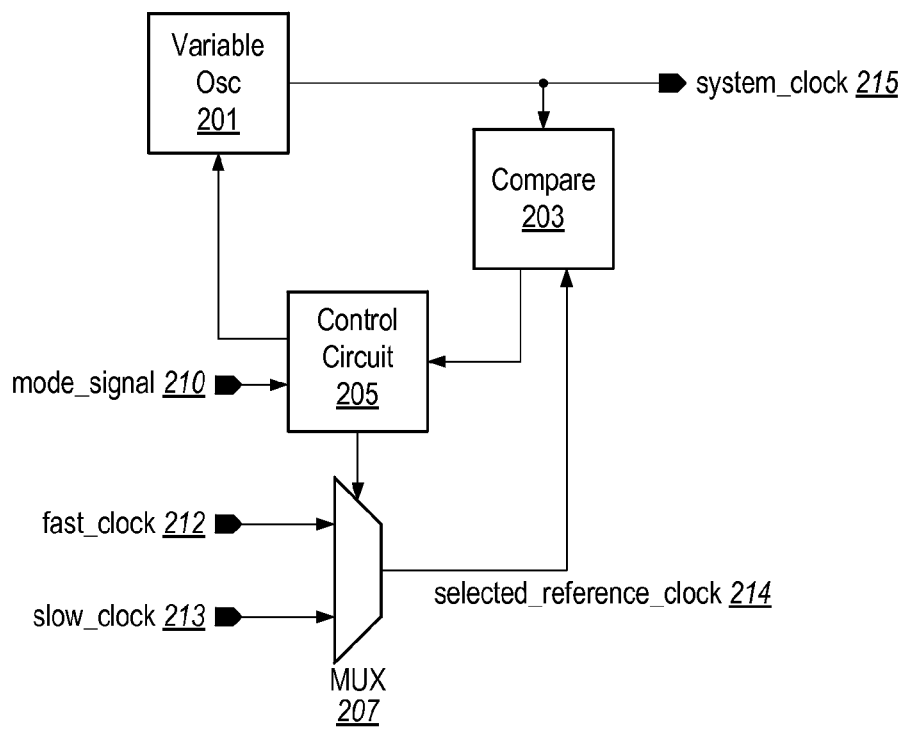
FIG. 2 illustrates a block diagram of a clock generation unit.

Turning to FIG. 2, an block diagram of an embodiment of a Clock Generation Unit (CGU) is illustrated. CGU 200 may represent a component or sub-component within an SoC, such as, SoC 100. In the illustrated embodiment, CGU 200 corresponds to a closed-loop clock signal generator that may be included in clock generator 107 in FIG. 1. An output of CGU 200, i.e., system_clock 215, may be used as a clock input to one or more functional blocks of SOC 100, such as, for example, processor 101. In some embodiments, system clock 215 may be used to clock only a portion of processor 101. CGU 200 may include variable oscillator (Variable Osc) 201 coupled to comparison unit (Compare) 203, and control circuit 205. Control circuit 205 may include multiplexing unit (MUX) 207. Mode signal 210 may be received into control circuit 205 and two reference clock signals (fast_ref_clock) 212 and (slow_ref_clock) 213 may be received by MUX 207. Selected reference clock (sel_ref_clock) 214 may be an output of MUX 207 and system clock 215 may be the output signal generated by CGU 200.

CGU 200 may correspond to any of an FFL, PLL, DLL or other type of closed loop clock generation circuit that may be included in clock generator 107. An FFL will be used for the following examples, however, PLL and DLL embodiments are applicable. CGU 200 may generate a clock output for use by one or more functional blocks of SoC 100. In some embodiments, CGU 200 may be capable of generating a clock signal with one of multiple selectable target frequencies. While, in other embodiments, CGU may be configured to generate a clock signal at a single target frequency. In many embodiments, CGU 200 may be configured to generate system_clock 215 at a frequency that is an integer multiple of the frequency of selected_reference_clock 214. In other embodiments, however, a fractional, i.e., non-integer, multiple of selected_reference_clock 214 may be used to set the frequency of system_clock 215, including fractional multiples less than one, resulting in a frequency of system_clock 215 that is less than the frequency of selected_reference_clock 214.

Variable oscillator 201 may output system_clock 215 with a frequency dependent on a comparison of the frequency of system_clock 215 and selected_reference_clock 214 within comparison circuit 203. Comparison unit 203 may compare a frequency difference between system_clock 215 and selected_reference_clock 214. Control circuit 205 may receive a value from comparison unit 203 indicative of the frequency difference and send a value to variable oscillator 201 to adjust the frequency of system_clock 215 closer to a target frequency that has been determined in control circuit 205. Control circuit 205 may also receive mode_signal 210 which may include an indication if CGU 200 should operate in a higher accuracy mode or reduced power mode. Based on a value of mode_signal 210, control circuit 205 may send a value to MUX 207 to select either fast_clock signal 212 or slow_clock signal 213 to be used as selected_reference_clock 214.

In an example embodiment, the target frequency may be set to 768 MHz and mode_signal 210 may have a value corresponding to the higher accuracy mode. Control circuit 205 may initialize variable oscillator 201 with a value that causes system_clock 215 to be generated at the target frequency (or close to the target frequency) and may configure MUX 207 to select fast_clock signal 212 as selected_reference_clock 214. If fast_clock signal 212 has a frequency of 24 MHz and the target frequency is 768 MHz, then 32 cycles of system_clock 215 are expected to occur in one period of fast_clock signal 212 (or 64 cycles of system_clock 215 in two periods of fast_clock signal 212). Accordingly, control circuit 205 may configure comparison unit 203 to have a target count value of 32. In some embodiments, this target count value may be stored in a register or other suitable memory within comparison unit 203. If comparison unit 203 counts more cycles of system_clock 215 than the target count value of 32 during a period of fast_clock signal 212 then system_clock 215 is running fast. Comparison unit 203 may generate a comparison value corresponding to the number of extra cycles counted. Comparison unit 203 may send the comparison value to control circuit 205, and control circuit 205 may adjust variable oscillator 201 to reduce the frequency of system_clock 215. Conversely, if comparison unit 203 counts less than 32 cycles of system_clock 215, then system_clock 215 is running slow. Comparison unit 203 may generate a comparison value corresponding to the number of missing cycles counted, as a negative number. Comparison unit 203 may send the comparison value to control circuit 205 and control circuit 205 may adjust variable oscillator 201 to increase the frequency of system_clock 215. The FLL may be considered locked if the difference between the target count value and the actual count value is within a threshold range of values.

It is noted that the operation of CGU 200 described above may be referred to as a "closed-loop operating mode" or simply "closed-loop mode." As used herein, a "closed-loop operating mode" refers to a mode in which a clock generator uses feedback from the comparison of a clock output signal (i.e., system_clock 215) to a reference clock signal (i.e., selected_reference_clock 214) to adjust the frequency of the clock output signal. During a closed-loop operating mode, the clock generator may repeatedly adjust the variable oscillator until the frequency of the clock output signal is within a predetermined range of the target frequency. Once the frequency of the clock output signal is within the predetermined range of the target frequency, the clock generator may be considered to be in a "locked state."

Control circuit 205 may generate a correction value based on the comparison value received from comparison unit 203. In some embodiments, the comparison value may be sent directly to variable oscillator 201. For example, variable oscillator 201 may correspond to a digitally-controlled oscillator (DCO) and a digital value setting the current frequency may be adjusted based on the comparison value received from comparison unit 203. In other embodiments, control circuit 205 may receive the comparison value from comparison unit 203 and may modify a control signal to variable oscillator 201 as necessary. Determining a modification of the control signal to variable oscillator 201 dependent upon the received comparison value may be referred to as "filtering" the feedback from the comparison. Various methods for filtering comparison feedback to determine a modification to a variable oscillator are known and contemplated for use in control circuit 205.

A value of mode_signal 210 may change to indicate a desired transition to the reduced power mode. In response to the new value of mode_signal 210, control circuit 205 may let variable oscillator 201 continue running in an open-loop operating mode, i.e., running based on the last comparison value received from comparison unit 203 using fast_clock signal 212. During the transition time to the reduced power mode, in some embodiments, the frequency of system_clock 215 may drift slightly depending on any changes in operating conditions or noise in SoC 100. Any frequency drift, however, may be negligible during the time required to reconfigure comparison unit 203 for the switch from fast_clock signal 212 to slow_clock signal 213.

As used herein, "open-loop operating mode" or "open-loop mode" refers to an operational mode of a clock generator in which feedback from the output clock signal is not used to adjust the frequency of the output clock signal. Referring to the present example, CGU 200 operates in an open-loop mode when control circuit 205 does not use comparison values from comparison unit 203 to adjust variable oscillator 201. In some embodiments, comparison unit 203 may continue to perform comparisons of system_clock 215 to selected_reference_clock 214 in open-loop mode and control circuit 205 ignores the results. In other embodiments, comparison operations may be suspended in comparison unit 203 during open-loop operating mode. In the open-loop operating mode, CGU may be considered to be in an "unlocked state" and the frequency of system_clock 215 may drift outside of the predetermined range from the target frequency.

While CGU 200 is in the open-loop mode, control circuit 205 may adjust inputs to MUX 207 to select slow_clock signal 213 to be used as selected_reference_clock 214. In addition, control circuit 205 may adjust the target count value for comparison unit 203 to account for the slower frequency of slow_clock signal 213, such that the frequency of system_clock 215 is maintained at the target frequency, (or at substantially the same as the target frequency, e.g. within 3%). Returning to the example target frequency of 768 MHz, if slow_clock signal 213 has a frequency of 32 KHz, then a count of 24,000 cycles of system_clock 215, rather than 32 cycles as when using the fast_clock signal 212, would be expected within a period of slow_clock signal 213 when the frequency of system_clock 215 is at the target frequency. Accordingly, control circuit 205 may adjust the target count value of comparison unit 203 to the new count value of 24,000, such that the frequency of system_clock 215 is maintained at the target frequency. In some embodiments, this target count value may be stored in the previously described register within comparison unit 203, replacing the target count value used in the higher accuracy mode. In other embodiments, a first register (or memory location) may be used to store the target count value for the higher accuracy mode and a second register used to store the target count value for the reduced power mode, such that control circuit 205 causes comparison unit 203 to select the target count value from the register corresponding to the current mode of CGU 200.

Once comparison unit 203 has been reconfigured for the reduced power mode, CGU 200 may again operate in closed-loop mode and comparisons of system_clock 215 may resume using slow_clock signal 213 and the new target count value of 24,000. Control circuit 205 may resume updating variable oscillator 201 upon receiving new comparison values from comparison unit 203. In various embodiments, the transition from open-loop mode back into closed-loop mode may be in response to control circuit 205 entering a state corresponding to the reduced power mode, may be in response to a signal asserted by control circuit 205 indicating that comparison unit 203 and MUX 207 are configured for the reduced power mode, or may be in response to a predetermined amount of time elapsing since entering the open-loop mode. In some embodiments, the transition from the higher accuracy mode to the reduced power mode or vice versa may occur in a short amount of time, such that the frequency of system_clock 215 does not vary outside of the predetermined range from the target frequency and CGU 200 remains locked during the transition.

It may be seen from the preceding example how the higher frequency of fast_clock signal 212 may support a higher accuracy system_clock 215. When fast_clock signal 212 is used as selected_reference_clock 214, a single period of the 24 MHz clock will be 41.6 nanoseconds. In contrast, a single period of the 32 KHz slow_clock signal 213 will be 31.25 microseconds. If a comparison value is generated for each cycle of selected_reference_clock 214, then fast_clock signal 212 will provide over 750 comparison values for one comparison value of slow_clock signal 213. Even if a comparison value is taken only once every 3 cycles when fast_clock signal 212 is selected, 250 values will be generated in one period of slow_clock signal 213. More frequent comparison value may allow control circuit 205 to update variable oscillator 201 more frequently, thereby reducing an amount of time system_clock 215 may drift between updates.

It is noted that the embodiment of CGU 200 as illustrated in FIG. 2 is merely an example. The illustration of FIG. 2 has been simplified to highlight features relevant to this disclosure. Various embodiments may include different configurations of the functional blocks, including additional blocks. Furthermore, although an FLL is used in the examples, the features described may apply to any suitable embodiment of a closed loop clock generation unit, such as a PLL or a DLL.

Figure 3:
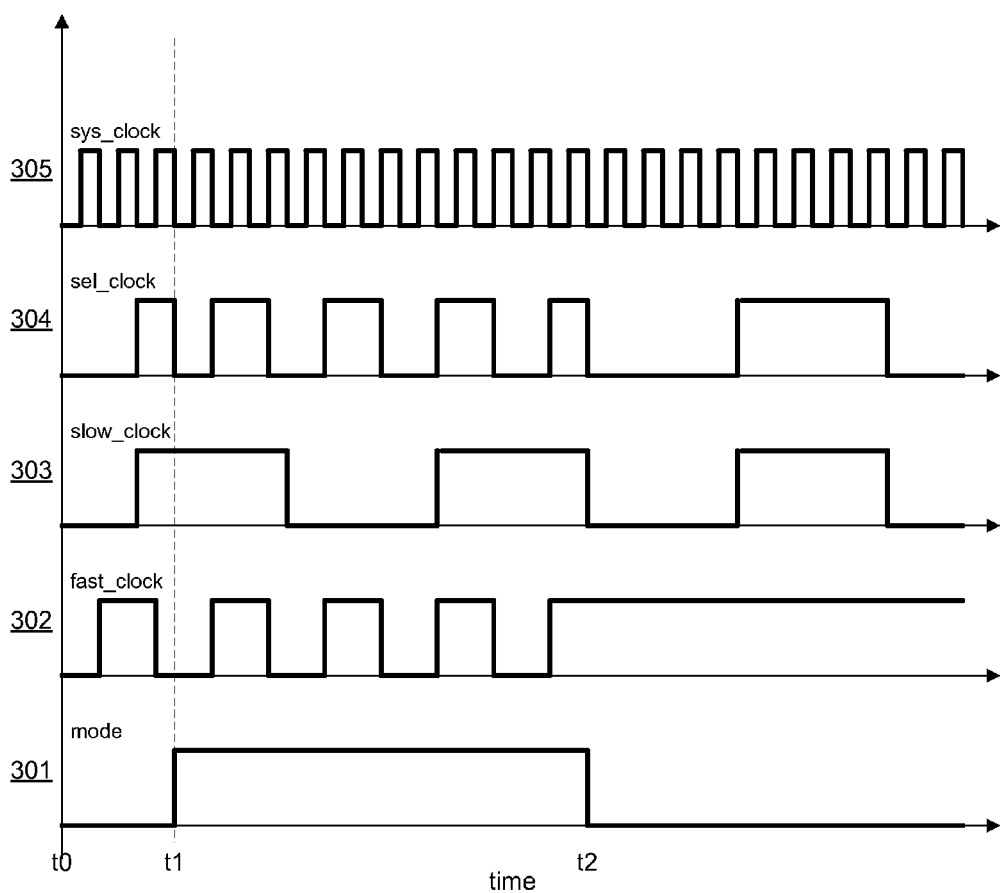
FIG. 3 shows a first timing diagram illustrating possible signals of an embodiment of a clock generation unit.

Moving to FIG. 3, a timing diagram is illustrated including possible signals associated with an embodiment of GCU 200 presented in FIG. 2. The signals of timing diagram 300 illustrate logic levels versus time. Referring collectively to FIG. 2 and FIG. 3, timing diagram 300 illustrates mode 301 corresponding to mode_signal 210; fast_clock 302 corresponding to fast_ref_clock 213; slow_clock 303 corresponding to slow_clock signal 213; sel_clock 304 corresponding to selected_reference_clock 214; and sys_clock 305 corresponding to system_clock.

At time t0, mode 301 is low, which may correspond to a reduced power mode in which slow_clock 303 is selected as the source clock for sel_clock 304. CGU 200 may be in a closed-loop mode with sys_clock 305 oscillating at a target frequency based on the frequency of sel_clock 304. Fast clock 302 may or may not be active at time t0. Fast_clock 302 may, however, be activated at some time before time t1.

Mode 301 transitions high at time t1, which may correspond to a higher accuracy mode for CGU 200. Control circuit 205 switches MUX 207 to select fast_clock 302 as the source for sel_clock 304. During the switch, sys_clock 305 continues to oscillate at or near the target frequency in an open-loop operating mode, i.e., without updates from control circuit 205, until comparison unit 203 has been configured for comparisons using fast_clock 302 rather than slow_clock 303. At time t1, comparison unit 203 may be actively comparing sys_clock 305 to sel_clock 304. In some embodiments, comparison unit 203 may complete the current comparison, with control circuit 205 holding off on switching MUX 207 to fast_clock 302 until receiving the next comparison value from comparison unit 203. In various embodiments, the current comparison is aborted and MUX 207 is switched to fast_clock 302 without waiting for another comparison value. CGU 200 may re-enter the closed-loop mode and comparison unit 203 may resume comparisons of sys_clock 305 to sel_clock 304 once MUX 207 has switched to fast_clock 302 and comparison unit 203 has finished reconfiguration. Control circuit 205 may update the frequency of sys_clock 305 as comparison values are received from comparison unit 203. Slow_clock 303 may or may not be disabled in response to the switch to fast_clock 302. In some embodiments, slow_clock may be used by other parts of SoC 100, while in other embodiments, slow_clock 303 may be disabled, either locally in CGU 200 or at the clock source. As illustrated, slow_clock 303 remains active.

At time t2, mode 301 transitions low, indicating a switch back to the reduced power mode. Comparison unit 203 may abort a currently active comparison cycle and control circuit 205 switches MUX 207 back to slow_clock 303. Comparison unit 203 is reconfigured for use with slow_clock 303. Again, sys_clock 305 continues to oscillate in the open-loop mode until comparison unit 203 resumes comparison cycles using slow_clock 303. In some embodiments, fast_clock 302 may cease oscillating at time t2, either remaining in the state it is at or resetting to a default state, low or high, as illustrated. In other embodiments, fast_clock 302 may continue oscillating for one or more cycles.

It is noted that timing diagram 300 of FIG. 3 merely illustrates examples of signals resulting from one embodiment of CGU 200. The signals are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 4:
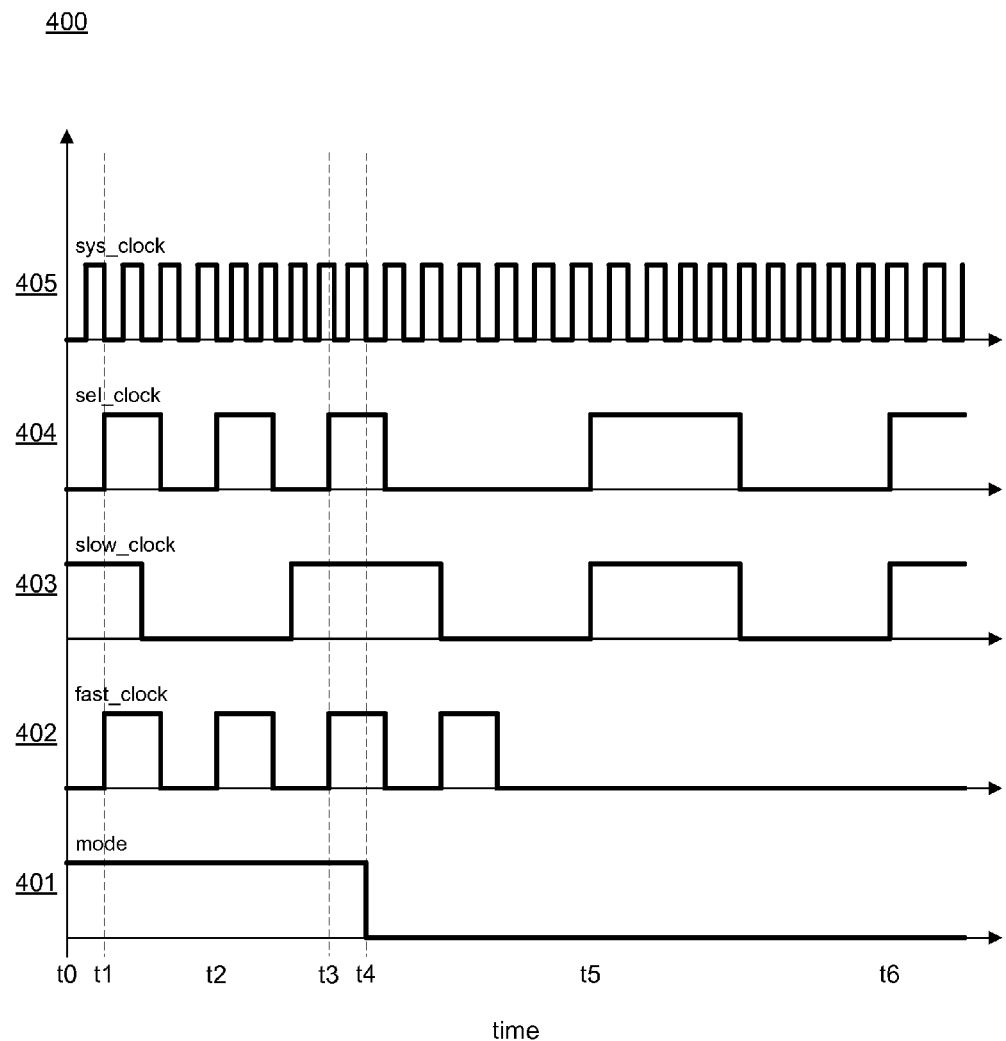
FIG. 4 illustrates a second timing diagram of possible signals of an embodiment of a clock generation unit.

Turning now to FIG. 4, another timing diagram of possible signals of an embodiment of CGU 200 is presented. Signals 401 through 405 correspond to signals 301 through 305 presented in FIG. 3. Timing diagram 400 illustrates comparison cycles when both a faster clock signal and a slower clock signal are used as reference clocks in CGU 200.

Referring collectively to CGU 200 in FIG. 2 and timing diagram 400 of FIG. 4, the signals begin at time t0. At time t0, mode 401 is high, indicating that a higher accuracy mode is selected, corresponding to fast_clock 402 being selected as the source for sel_clock 404. CGU 200 may be operating in a closed-loop mode. In the illustrated embodiment, slow_clock 403 continues to oscillate despite fast_clock 402 being selected as the source for sel_clock 404. In other embodiments, slow_clock 403 may be disabled, either globally for all circuits in SoC 100, or locally for CGU 200. Sys_clock 405 is oscillating at a target frequency dependent upon sel_clock 404.

At time t1, a comparison cycle begins, in which comparison unit 203 compares a frequency of system_clock 405 to a frequency of sel_clock 404. For one cycle of sel_clock 404, comparison unit 203 may count a number of cycles of sys_clock 405 by incrementing a counter for each rising or falling transition of sys_clock 405 between two consecutive rising transitions of sel_clock 404. In the illustrated example, comparison unit 203 has a target count value of three cycles of sys_clock 405 during one cycle of sel_clock 404. Between times t1 and t2, sys_clock 405 is oscillating at the target frequency, and therefore, the comparison unit 203 counts three cycles of sys_clock 405 during the comparison cycle. Comparison unit 203 determines a comparison value of zero by subtracting the target count value (three) from the actual count value (three). The comparison value may be sent to control circuit 205 which determines than no adjustment to variable oscillator 201 is needed in response to the current comparison cycle. Many variations of determining a comparison value are known and contemplated for other embodiments.

Between times t2 and t3, a second comparison cycle is performed in comparison unit 203. The frequency of sys_clock 405 has drifted such that comparison unit 203 counts four cycles of sys_clock 405 instead of three, resulting in a comparison value of one. This new comparison value is sent to control circuit 205, which may determine a new value for variable oscillator 201 corresponding to a factor with which to reduce the frequency of sys_clock 405. After time t3, variable oscillator 201 generates sys_clock 405 closer to the target frequency.

Mode 401 transitions low at time t4, indicating a switch to a reduced power mode. CGU 200 transitions to an open-loop mode. Control circuit 205 selects slow_clock 403 as the output of MUX 207, and therefore as the source for sel_clock 404. In some embodiments, fast_clock 402 may be disabled, either at the clock source for SoC 100 or disabled for portions of SoC 100, including CGU 200. In the current embodiment, fast_clock 402 is disabled after the switch to slow_clock 403 and a current comparison cycle in comparison unit 203 is aborted. In other embodiments, fast_clock 402 may continue oscillating until the current comparison cycle has completed.

CGU 200 transitions back to the closed-loop mode before time t5. A next comparison cycle begins at the next rising edge of sel_clock 404, at time t5. When slow_clock 403 is selected as the source for sel_clock 404, comparison unit 203 is reconfigured with a target count value of eight instead of three. In the illustrated embodiment, however, the frequency of sys_clock 405 drifts again, resulting in comparison unit 203 counting ten cycles of sys_clock 405 during the one cycle of sel_clock 404. The comparison value is determined to be two, and is sent to control circuit 205 which determines a correction value to send to variable oscillator 201 to adjust the frequency of sys_clock 405 back to the target frequency. After time t6, variable oscillator 201 generates sys_clock 405 at a frequency closer to the target frequency.

From chart 400, it may be observed how a higher frequency clock source for sel_clock 404 may result in more frequent updates to the frequency of sys_clock 405 compared to lower frequency sources, such as slow_clock 403. These more frequent updates may allow less time for the frequency of sys_clock 405 to drift, thereby maintaining a higher level of accuracy. The longer time between completions of comparison cycles when using slow_clock 403 as the source for sel_clock 404 may allow more time for the frequency of sys_clock 405 to drift away from the target frequency. While the current example illustrates a slow_clock 403 with a frequency less than three times lower than fast_clock 402, other embodiments, may include fast_clock sources with frequencies ten times, one hundred times or even several thousand times faster than the slow_clock source.

A variety of operating conditions may affect the amount that the frequency of sys_clock 405 may drift over any given period of time. Such operating conditions may include, for example, operating temperature, switching noise in SoC 100, and voltage level of a power supply to CGU 200. Changes in some of these conditions may be detectable by SoC 100, and in some embodiments, SoC 100 may select an operating mode of CGU 200 dependent upon current conditions. For example, if SoC 100 includes a temperature sensor, temperature changes may be monitored and CGU 200 may be switched between higher accuracy and reduced power modes based on the temperature measurements.

In some embodiments, power to the functional blocks of SoC 100 may be provided by multiple power sources, such as, for example, voltage regulators, or by a voltage regulator with multiple regulation voltage levels. In such power managed systems, circuits and/or software executing in SoC 100 may determine which power supply signal is used at a given time. Variable oscillator 201 may be sensitive to changes in voltage levels, i.e., the frequency of sys_clock 405 may be expected to drift in response to a change in the power supply signal to CGU 200. For example, in one embodiment, power management unit 104 may adjust a voltage level of an output of a voltage regulator that provides the power supply signal to CGU 200. The accuracy of sys_clock 405 may be affected as the output of the voltage regulator adjusts to the new voltage level, regardless if the voltage level of the output is increased or decreased. Mode 401 may transition high before making changes to power supply signals coupled to CGU 200 in order to switch CGU 200 to the higher accuracy mode. After the change to the power supply signal has occurred and the voltage level of the power supply output has had time to stabilize to an acceptable level, mode 401 may transition low placing CGU 200 back into the reduced power mode.

In another example, power management 104 may switch from a first power source to a second power source to provide the power supply signal to CGU 200. The second power source may output a power supply signal that includes more fluctuations in the voltage level than the first power source. In preparation for the power source change, power management unit 104 may cause mode 401 to transition high to signal CGU 200 to enter the higher accuracy mode while the second power source is used to provide the power supply signal to CGU 200. Conversely, power management unit 104 may cause mode 401 to transition low after switching back to the first power source.

It is noted that FIG. 4 is merely an example of signals that may result from one embodiment CGU 200. Again, the signals are simplified to provide clear descriptions of the disclosed concepts. In other embodiments, the signals may appear different due various influences such as technology choices for building the circuits, actual circuit design and layout, ambient noise in the environment, choice of power supplies, etc. Frequencies of the various clocks may differ from those illustrated. Additionally, changes to sys_clock 405 may occur over more cycles than illustrated. In other embodiments, comparison unit 203 may be configured to count cycles of sys_clock 405 for more than one period of sel_clock 404.

Figure 5:
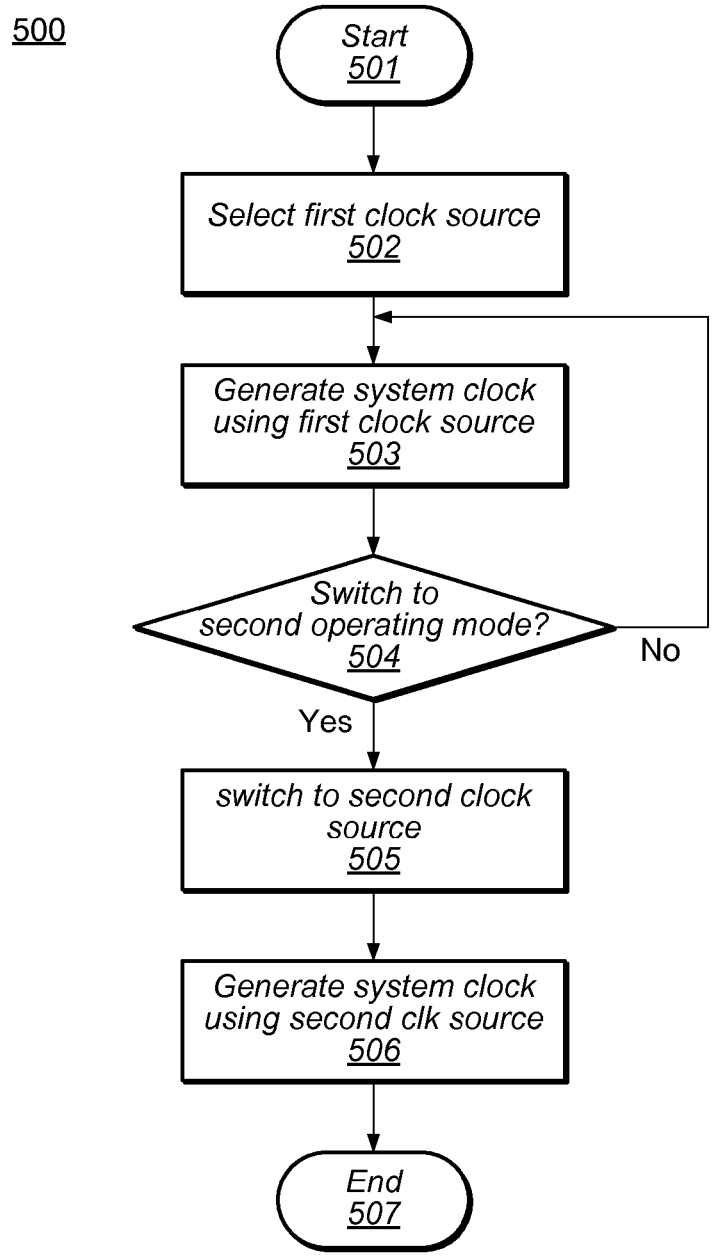
FIG. 5 depicts a flowchart illustrating an embodiment of a method for switching from a first reference clock signal to a second reference clock signal.

Moving now to FIG. 5, a flowchart of an embodiment of a method for switching from a first reference clock signal to a second reference clock signal is illustrated. The method may be applied to a clock generation unit, such as, for example, CGU 200 in FIG. 2, in a system such as SoC 100 in FIG. 1. Referring collectively to SoC 100, CGU 200, and the flowchart in FIG. 5, the method may begin in block 501.

A first clock source for CGU 200 may be selected (block 502). Fast_clock signal 212 or slow_clock signal 213 may be selected by control circuit 205 using MUX 207. The selection may depend on a first value of mode_signal 210, which may indicate whether a high accuracy operating mode or a reduced power operating mode has been requested. For example, slow_clock signal 213 is selected to be used as a source for selected_reference_clock 214 when the reduced power operating mode has been requested.

The selected clock source may be used to generate a system_clock (block 503). CGU 200 may enter a closed-loop mode and selected_reference_clock 214 may be used to generate a system_clock signal, such as, for example, system_clock 215. In some embodiments, CGU 200 may be configured to generate system_clock 215 at a frequency that is an integer multiple of the frequency of selected_reference_clock 214. In other embodiments, however, a fractional, i.e., non-integer, multiple of selected_reference_clock 214 may be used to set the frequency of system_clock 215, including fractional multiples less than one, resulting in a frequency of system_clock 215 that is less than the frequency of selected_reference_clock 214.

The method may depend on a value of mode_signal 210 (block 504). A second value of mode_signal 210 may be received by control circuit 205, indicating a request to change operating modes. The second value of mode_signal 210 may correspond to a request to switch CGU 200 from the reduced power operating mode to a higher accuracy operating mode. In some embodiments, the request may come from software executing on processor 101 in SoC 100. In other embodiments, the request may come from hardware in SoC 100, such as, for example, power management 104, which may request a change to the high accuracy operating mode in response to a pending change in a voltage supply signal. If mode_signal 210 remains at the first value, then the method may return to block 503 to continue generation of system_clock 215 dependent upon slow_clock signal 213. Otherwise, if the second value of mode_signal 210 is received, then the method may move to block 505 to change operating modes.

Control circuit 205 may switch MUX 207 to output fast_clock signal 212 in response to receiving the second value of mode_signal 210 (block 505). The second value of mode_signal 210 may indicate a request to change to the higher accuracy operating mode. As previously disclosed, variable oscillator 201 may, in some embodiments, experience voltage drift in response to changes in a voltage level of a power supply signal to CGU 200. By switching to the higher accuracy operating mode during a power supply change, potential frequency drift in variable oscillator 201 due to any resulting voltage level changes in CGU 200 may be reduced to an acceptable level. CGU 200 may enter an open-loop mode during the transition from the reduced power mode to the higher accuracy mode.

System clock 215 may be generated dependent on fast_clock signal 212 (block 506). CGU 200 may return to the closed-loop mode upon completing the transition to the higher accuracy mode. Generating system_clock 215 from fast_clock signal 212 may reduce a time between comparison cycles in comparison unit 203. The reduced time between comparison cycles may result in more frequent updates to variable oscillator 201 and thereby, may reduce an amount of frequency drift in system_clock 215. The method may end in block 507.

It is noted that the method illustrated in FIG. 5 is merely an example embodiment. Variations on this method are possible. Some operations may be performed in a different sequence, and/or additional operations may be included.

Figure 6:
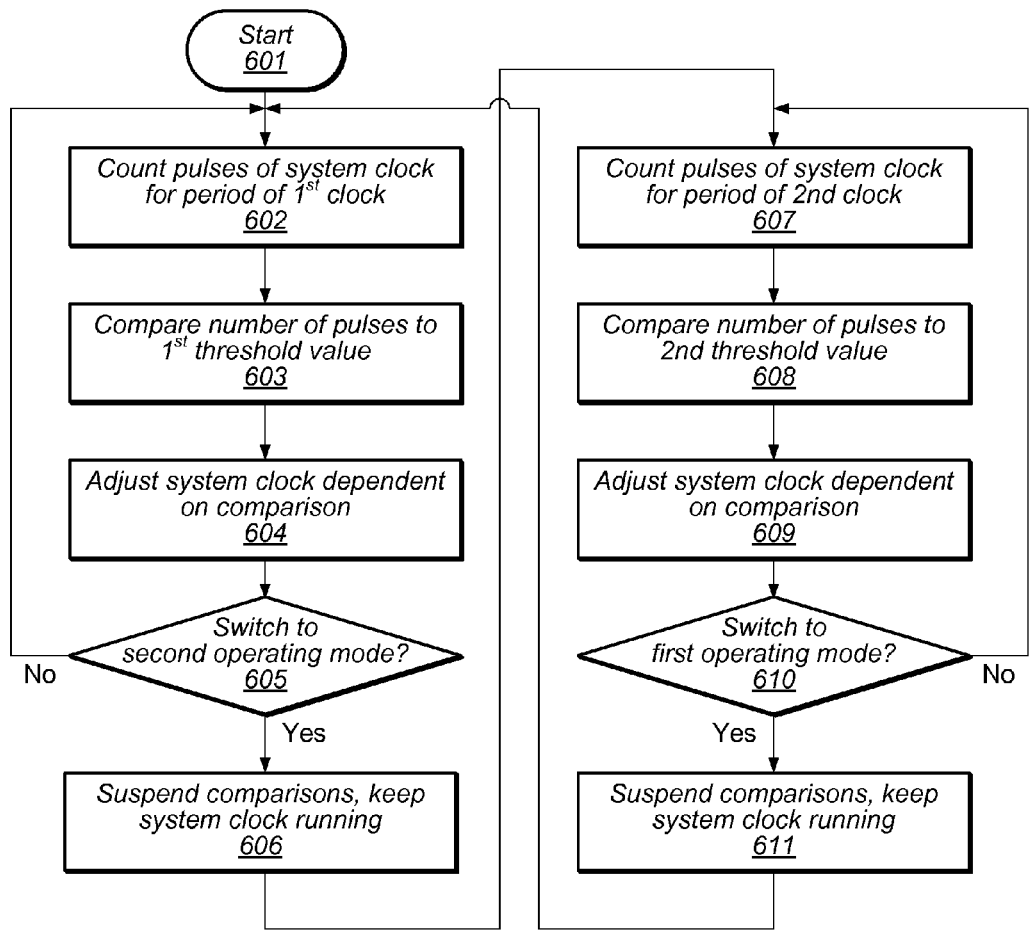
FIG. 6 illustrates a flowchart of an embodiment of a method for adjusting a system clock signal using two different reference clocks.

Turning to FIG. 6, a flowchart of an embodiment of a method for adjusting a system_clock signal using two different reference clocks is illustrated. The method may be applied to a clock generation unit, such as, for example, CGU 200 in FIG. 2, in a system such as SoC 100 in FIG. 1. Referring collectively to SoC 100, CGU 200, and the flowchart in FIG. 6, the method may begin in block 601, with a value for mode_signal 210 corresponding to a higher accuracy mode of operation, and therefore, with fast_clock signal 212 having been selected as selected_reference_clock 214.

Variable oscillator 201 may output system_clock 215 and comparison unit 203 may count a number of clock pulses of system_clock 215 for one or more periods of selected_reference_clock 214 (block 602). When CGU 200 becomes operational after a power-up or reset, variable oscillator 201 may start generating system_clock 215 at a default frequency or may resume using previous settings if available. CGU enters a closed-loop mode. The frequency of system_clock 215 may or may not be close to a current target frequency, and, therefore, comparison unit 203 may compare the frequency of system_clock 215 with a frequency of selected_reference_clock 214 which may be from a more accurate clock source than variable oscillator 201. Depending on the relative frequencies of system_clock 215 and selected_reference_clock 214, comparison unit 203 may count for a single period of selected_reference_clock 214 to create a fast comparison cycle, or may count for several periods of selected_reference_clock 214 to create a larger measurement size.

Comparison unit 203 may compare the number of system_clock 215 pulses counted in block 602 to a first threshold value (block 603). When fast_clock signal 212 is selected as the source for selected_reference_clock 214, comparison unit 203 may be set to use a corresponding threshold value. In some embodiments, the first threshold value may be adjusted in relation to the current target frequency. Comparison unit 203 may send a value representative of the difference between the number of system_clock 215 pulses and the first threshold value to control circuit 205.

Control circuit 205 may adjust variable oscillator 201 (block 604). Upon receiving the value from comparison unit 203, control circuit may determine, dependent upon the value, if the frequency of system_clock 215 is too high, to low, or within an acceptable range of the current target frequency. If the frequency is determined to be too high or too low, then control circuit 205 may determine and apply an adjustment for variable oscillator 201 to bring the frequency within the acceptable range.

Further operations of the method may depend on a value of mode_signal 210 (block 605). A value of mode_signal 210 may change during operation of CGU 200 in the higher accuracy mode. The change may be requested by software executed by processor 101 or by another functional block of SoC 100 in FIG. 1. For example, an operating system executing on processor 101 may determine that the current SoC operations do not require the higher accuracy mode and request a switch to a reduced power mode. In the present embodiment, the value of mode_signal 210 represents the requested mode for CGU 200, either the higher accuracy mode or the reduced power mode. If the value of mode_signal 210 still corresponds to the higher accuracy mode, then the method may return to block 602 to continue comparisons with fast_clock signal 212. Otherwise, if mode_signal 210 has changed to correspond to the reduced power mode, then the method may move to block 606 to begin the transition to slow_clock signal 213.

Comparison unit 203 may suspend comparison cycles while variable oscillator 201 continues to generate system_clock 215 using current settings (block 606). In response to the change in the value of mode_signal 210, CGU 200 may enter an open-loop mode and control circuit 205 may, therefore, instruct comparison unit 203 to suspend comparison cycles and reconfigure comparison unit 203 to use slow_clock signal 213 rather than fast_clock signal 212 for the comparisons. Control circuit 205 may cause comparison unit 203 to use a second threshold value for comparison cycles in place of the first threshold value used in conjunction with fast_clock signal 212. The second threshold value may correspond to a number of expected pulses of system_clock 215 operating at the current target frequency during one cycle of slow_clock signal 213. During the reconfiguration of comparison unit 203, variable oscillator 201 may continue to generate system_clock 215 using the last settings provided by control circuit 205 before suspending comparisons. While the settings of variable oscillator 201 may remain constant during the reconfiguration, the frequency of system_clock 215 may drift as previously discussed. In some embodiments, however, CGU 200 may transition between operating modes quickly enough that system_clock 215 does not drift outside of the predetermined range from the target frequency, i.e., remains in a locked state.

Comparison unit 203 may count the number of pulses of system_clock 215 occurring during one period of slow_clock signal 213 (block 607). Once comparison unit 203 has been reconfigured to use slow_clock signal 213, CGU 200 may return to the closed-loop mode and control circuit 205 may instruct comparison unit 203 to resume comparisons of system_clock 215 with selected_reference_clock 214 (now slow_clock signal 213). In some embodiments, comparison unit 203 counts pulses of system_clock 215 for one period of selected_reference_clock 214, while, in other embodiments, comparison unit 203 counts clock pulses for more than one period of sel_ref_clock.

Comparison unit 203 may compare the number of pulses counted in block 607 to the second threshold value (block 608). In some embodiments, the second threshold value is greater than the first threshold value since periods of slow_clock signal 213 will result in a longer comparison cycle than an equal number of periods of fast_clock signal 212. For example, if the frequency of fast_clock signal 212 is 1 MHz and the frequency of slow_clock signal 213 is 10 KHz, then the corresponding 100 microsecond period of slow_clock signal 213 will be 100 times longer than the 1 microsecond period of fast_clock signal 212. In such an example, if a single period of each reference clock is used for a comparison cycle, then the second threshold value would be 100 times greater than the first threshold value. Upon completing a comparison cycle, comparison unit 203 may again send a value to control circuit 205 representing the difference between the number of system_clock 215 pulses and the second threshold value.

Based on the value received in block 608, control circuit 205 may adjust variable oscillator 201 (block 609). Upon receiving the value from comparison unit 203, control circuit may again determine if the frequency of system_clock 215 is too high, to low, or within an acceptable range of the current target frequency. Control circuit 205 may then determine and apply a corresponding adjustment for variable oscillator 201 to bring the frequency of the output of variable oscillator 201 closer to the target frequency.

Further operations of the method may again depend on a value of mode_signal 210 (block 610). The value of mode_signal 210 may change during the operation of CGU 200 in the reduced power mode. The change may be requested by a functional block of SoC 100 in FIG. 1. For example, power management 104 may request the higher accuracy mode due to a switch to a power supply signal with a fluctuating voltage level. If the value of mode_signal 210 does not change, then the method may return to block 607 to continue comparisons using slow_clock signal 213. Otherwise, the method may move to block 611 to prepare for the switch back to the higher accuracy mode.

Comparison unit 203 may again suspend comparison cycles while variable oscillator 201 continues to generate system_clock 215 using current settings (block 611). In response to the change in the value of mode_signal 210, CGU may return to the open-loop mode and control circuit 205 may instruct comparison unit 203 to suspend comparison cycles and reconfigure comparison unit 203 to use fast_clock signal 212 rather than slow_clock signal 213 for the comparisons. While variable oscillator 201 continues to generate system_clock 215 without interruption, control circuit 205 may configure comparison unit 203 for use with fast_clock signal 212, including switching the threshold value back to the first threshold value. Once comparison unit 203 is configured for use with fast_clock signal 212, the method may return to block 602 to perform a next comparison cycle.

It is noted that the method illustrated in FIG. 6 is merely an example embodiment. Variations on this method are contemplated. Some operations may be performed in a different sequence, and/or additional operations may be included.

Numerous variations and modifications will become apparent to those skilled in the art once the above disclosure is fully appreciated. It is intended that the following claims be interpreted to embrace all such variations and modifications.

What is claimed is:

1. A system, comprising:
   a processor, wherein at least a portion of the processor is clocked by a system clock signal;
   a first clock source configured to generate a first reference clock signal;
   a second clock source configured to generate a second reference clock signal;
   wherein a frequency of the second reference clock signal is lower than a frequency of the first reference clock signal; and
   a clock generation unit configured to:
      operate in a first closed-loop mode of operation, wherein the clock generation unit is configured to generate the system clock signal at a target frequency by comparing the system clock signal to the first reference clock signal during the first closed-loop mode of operation;
      generate the system clock signal in an open-loop mode of operation in response to a transition in a control signal; and
      operate in a second closed-loop mode of operation after operating in the open-loop mode of operation, wherein the clock generation unit is configured to generate the system clock signal at substantially the same target frequency by comparing the system clock signal to the second reference clock signal during the second closed-loop mode of operation.

2. The system of claim 1, wherein the clock generation unit is further configured to:
   generate the system clock signal at a first multiple of the frequency of the first reference clock signal during the first closed-loop mode of operation; and
   generate the system clock signal at a second multiple of the frequency of the second reference clock signal during the second closed-loop mode of operation, wherein the second multiple is greater than the first multiple.

3. The system of claim 1, wherein, during the first closed-loop mode of operation, the clock generation unit is further configured to:
   determine a number of system clock signal pulses occurring during a given duration of the first reference clock signal;
   compare the number of system clock signal pulses to a first target count value to determine a first comparison value; and
   adjust the frequency of the system clock signal dependent upon the first comparison value.

4. The system of claim 3, wherein, during the second closed-loop mode of operation, the clock generation unit is further configured to:
   determine a number of system clock signal pulses occurring during a given duration of the second reference clock signal;
   compare the number of system clock signal pulses to a second target count value to determine a second comparison value; and adjust the frequency of the system clock signal dependent upon the second comparison value.

5. The system of claim 4, wherein the clock generation unit includes a comparison circuit, wherein the comparison circuit is configured to:
store the first target count value in a register responsive to operating in the first closed-loop mode of operation; and
change a value stored in the register from the first target count value to the second target count value while operating in the open-loop mode of operation.

6. The system of claim 1, wherein the first clock source is further configured to disable the generation of the first reference clock signal responsive to the clock generation unit operating in the second closed-loop mode of operation.

7. The system of claim 1, further comprising a power management unit with a plurality of power modes, wherein the power management unit is configured to request that the clock generation unit operate in the first closed-loop mode of operation in response to a determination that the power management unit is preparing to change power modes.

8. A method for operating a clock generation unit, comprising:
operating in a first closed-loop mode of operation, wherein operating in the first closed-loop mode of operation includes generating a system clock signal at a target frequency by comparing the system clock signal to a first reference clock signal;
generating the system clock signal in an open-loop mode of operation in response to a transition in a control signal; and
operating in a second closed-loop mode of operation after operating in the open-loop mode of operation, wherein operating in a second closed-loop mode of operation includes generating the system clock signal at substantially the same target frequency by comparing the system clock signal to a second reference clock signal;
wherein a frequency of the second reference clock signal is lower than a frequency of the first reference clock signal.

9. The method of claim 8, further comprising:
generating the system clock signal at a first multiple of the frequency of the first reference clock signal during the first closed-loop mode of operation; and
generating the system clock signal at a second multiple of the frequency of the second reference clock signal during the second closed-loop mode of operation, wherein the second multiple is greater than the first multiple.

10. The method of claim 8, during the first closed-loop mode of operation, further comprising:
determining a number of system clock signal pulses occurring during a given duration of the first reference clock signal;
comparing the number of system clock signal pulses to a first predetermined threshold number to determine a first comparison value; and
adjusting the frequency of the system clock signal dependent upon the first comparison value.

11. The method of claim 10, during the second closed-loop mode of operation, further comprising:
determining a number of system clock signal pulses occurring during a given duration of the second reference clock signal;
comparing the number of system clock signal pulses to a second predetermined threshold number to determine a second comparison value; and
adjusting the frequency of the system clock signal dependent upon the second comparison value.

12. The method of claim 11, wherein the given duration of the first reference clock signal corresponds to one period of the first reference clock signal, and wherein the given duration of the second reference clock signal corresponds to one period of the second reference clock signal.

13. The method of claim 8, further comprising disabling generation of the first reference clock signal with the first frequency responsive to operating in the second closed-loop mode of operation.

14. The method of claim 9, further comprising operating in the first closed-loop mode of operation in response to determining that a change in a power supply signal is pending.

15. An apparatus, comprising:
a first clock source configured to generate a first reference clock signal;
a second clock source configured to generate a second reference clock signal;
wherein a frequency of the second reference clock signal is lower than a frequency of the first reference clock signal; and
a clock generation unit configured to:
operate in a first closed-loop mode of operation, wherein the clock generation unit is configured to generate a system clock signal at a target frequency by comparing the system clock signal to the first reference clock signal during the first closed-loop mode of operation;
generate the system clock signal in an open-loop mode of operation in response to a transition in a control signal; and
operate in a second closed-loop mode of operation after operating in the open-loop mode of operation, wherein the clock generation unit is configured to generate the system clock signal at substantially the same target frequency by comparing the system clock signal to the second reference clock signal during the second closed-loop mode of operation.

16. The apparatus of claim 15, wherein the clock generation unit is further configured to:
generate the system clock signal at a first multiple of the frequency of the first reference clock signal during the first closed-loop mode of operation; and
generate the system clock signal at a second multiple of the frequency of the second reference clock signal during the second closed-loop mode of operation, wherein the second multiple is greater than the first multiple.

17. The apparatus of claim 15, wherein, during the first closed-loop mode of operation, the clock generation unit is further configured to:
determine a number of system clock signal pulses occurring during a given duration of the first reference clock signal;
compare the number of system clock signal pulses to a first target count value to determine a first comparison value; and
adjust the frequency of the system clock signal dependent upon the first comparison value.

18. The apparatus of claim 17, wherein, during the second closed-loop mode of operation, the clock generation unit is further configured to:
determine a number of system clock signal pulses occurring during a given duration of the second reference clock signal;
compare the number of system clock signal pulses to a second target count value to determine a second comparison value; and
adjust the frequency of the system clock signal dependent upon the second comparison value.

19. The apparatus of claim 18, wherein the clock generation unit includes a comparison circuit, wherein the comparison circuit is configured to:
    store the first target count value in a register responsive to operating in the first closed-loop mode of operation; and
    change a value stored in the register from the first target count value to the second target count value while operating in the open-loop mode of operation.

20. The apparatus of claim 15, further comprising a power management unit with a plurality of power modes, wherein the power management unit is configured to request that the clock generation unit operate in the first closed-loop mode of operation in response to a determination that the power management unit is preparing to change power modes.

* * * * *